United States Patent [19]

Hirai

[11] Patent Number: 5,210,938
[45] Date of Patent: May 18, 1993

[54] METHOD OF ASSEMBLING AN ELECTRONIC PART DEVICE

[75] Inventor: Minoru Hirai, Kyoto, Japan

[73] Assignee: Rohm Co., Ltd., Kyoto, Japan

[21] Appl. No.: 924,703

[22] Filed: Aug. 4, 1992

[30] Foreign Application Priority Data

Aug. 5, 1991 [JP] Japan .................. 3-221010

[51] Int. Cl.⁵ .................................. H05K 3/34
[52] U.S. Cl. ............................ 29/840; 29/832; 156/85; 156/276; 264/230; 361/400
[58] Field of Search ............ 29/832, 840; 156/85, 156/276, 307.1, 307.7; 264/230; 361/400, 417

[56] References Cited

U.S. PATENT DOCUMENTS

| | | | |
|---|---|---|---|
| 4,208,005 | 6/1980 | Nate et al. | 29/840 |
| 4,774,634 | 9/1988 | Tate et al. | 361/400 |
| 4,864,471 | 9/1989 | Hargasser et al. | 29/832 |
| 5,162,613 | 11/1992 | Schoenthaler | 29/832 |

Primary Examiner—P. W. Echols
Attorney, Agent, or Firm—Nikaido, Marmelstein, Murray & Oram

[57] ABSTRACT

In a method of assembling an electronic part device and a circuit board, an electrode formed on the electronic part device and a conductive pattern formed on the circuit board so as to be opposite to the electrode are positioned, and a thermosetting resin sheet including a thermally shrinkable particle and provided between the electronic part device and the circuit board is hardened and shrunk.

5 Claims, 3 Drawing Sheets

METHOD OF ASSEMBLING AN ELECTRONIC PART DEVICE

BACKGROUND OF THE INVENTION

1. Field of the Invention

The present invention relate to a method of assembling an electronic part device such as an LSI (large-scale integrated circuit) according to a face down method.

2. Description of the Prior Art

A flip chip method is one of the methods of assembling a semiconductor device made of a material such as Si and GaAs onto a circuit board. In this method, a semiconductor device where a bump is formed is assembled onto a circuit board according to a face down method.

FIG. 1, which shows a prior art, is a cross-sectional view showing a condition where a semiconductor device 10 is assembled onto a circuit board 11.

In the figure, the numerals 12 are bumps made of solder or gold and formed on the semiconductor 10. The bumps 12 are connected to conductive patterns 13 consisting of an ITO (indium tin oxide) film formed on the circuit board 11. The numeral 14 is a thermosetting resin sheet for fixing the semiconductor device 10 to the circuit board 11. The thermosetting resin sheet 14 hardens by being heated so that the volume thereof shrinks. Thereby, the semiconductor device 10 is fixed to the circuit board 11.

The process of the above-mentioned assembling method is as follows: first, the thermosetting resin sheet 14 with a thickness of approximately 25 μm is bonded onto the circuit board 11; then, the semiconductor device 10 is arranged with its face down while the bumps 12 and the conductive patterns 13 formed on the circuit board 11 are positioned; and thereafter, the thermosetting resin sheet 14 is hardened while a condition is being maintained where the bumps 12 and the conductive patterns 13 are pressurized by a heating and pressurizing apparatus.

In a case where the bumps 12 formed on the semiconductor device 10 and the conductive patterns 13 formed on the circuit board 11 are pressed against each other by utilizing volume shrinkage force generated when the thermosetting resin sheet 14 is hardened as described above, the condition where the bumps 12 and the conductive patterns 13 are pressed against each other is maintained only by the thermosetting resin sheet 14 which is usually arranged in the center of the semiconductor device 10.

However, when the number of bumps is increased compared to an area where the thermosetting resin sheet 14 is bonded, the shrinkage force of the resin which acts on one bump decreases, so that an excellent pressing condition of the bumps 12 and the conductive patterns 13 cannot be maintained. Thereby, mal-assembling can occur.

SUMMARY OF THE INVENTION

An object of the present invention is to provide a method of assembling an electronic part device where large shrinkage force is obtained even if an area where a thermosetting resin sheet is bonded is small and mal-assembling never occurs between a bump and a conductive pattern.

In an assembling method of the present invention, an electrode formed on an electronic part device and a conductive pattern formed on a circuit board so as to be opposite to said electrode are positioned, and a thermosetting resin sheet including a thermally shrinkable particle and provided between said electronic part device and said circuit board is hardened and shrunk.

With such a method, when the electronic part device and the circuit board are assembled, since the shrinkage force generated by a thermally shrinkable particle is added to the shrinkage force of the thermosetting resin sheet, stronger shrinkage force is generated. Therefore, no mal-assembling occurs between the electrode formed on the electronic part device and the conductive pattern formed on the circuit board, and reliability of the assembling improves.

BRIEF DESCRIPTION OF THE DRAWINGS

This and other objects and features of this invention will become clear from the following description taken in conjunction with the preferred embodiments with reference to the accompanied drawings in which.

DESCRIPTION OF THE PREFERRED EMBODIMENTS

Figure 1:
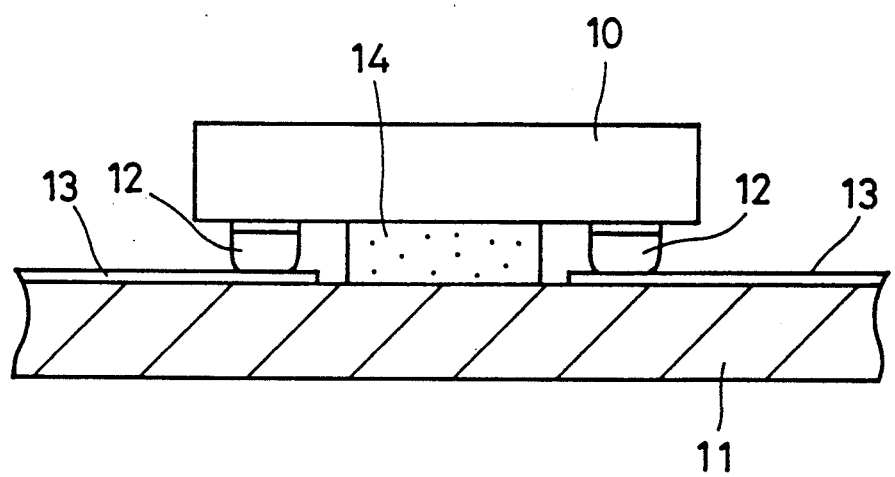
FIG. 1 is a view showing a conventional assembling method.

An embodiment of the present invention will hereinafter be described with reference to the drawing.

Figure 2:
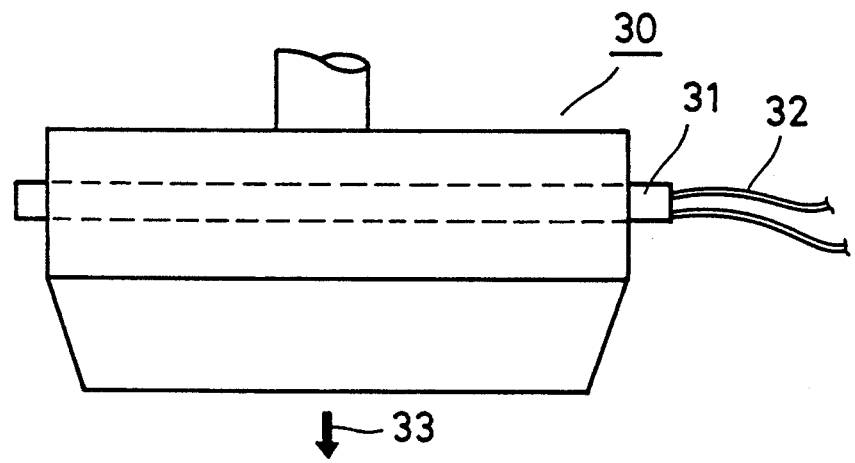
FIG. 2 is a view showing an assembling method of the present invention.
Figure 2:
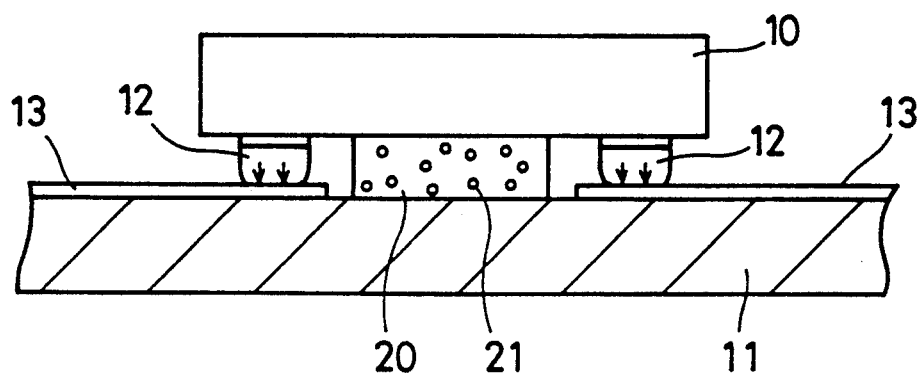

FIG. 2 shows an assembling structure embodying the present invention.

A sheet 20 employed for this embodiment is a thermosetting resin sheet (for example, conventionally-used epoxy resin) including thermally shrinkable particles 21 (for example, PVC (polyvinyl chrolide) particles with a diameter of 5 to 20 μm).

While epoxy resin has a maximum volumetric shrinkage factor of approximately 5%, PVC has a maximum volumetric shrinkage factor of 50%. Shrinkage force of the embodiment of the present invention is calculated, and the calculation results are shown in the following table together with values relating to shrinkage force of a prior art where only epoxy resin is used.

| Conditions | B (Prior Art) Epoxy 100% Heating Temperature 80° C. | A (Present Invention) Epoxy 90% + PVC 10% Heating Temperature 80° C. | Epoxy 90% + PVC 10% Heating Temperature 120° C. |
| --- | --- | --- | --- |
| Increase and Decrease in Volume ΔV | −0.05 V (−5%) | −0.045 V (−4.5%) | −0.095 V (−9.5%) |
| Total Volume V | 0.95 V | 0.955 V | 0.905 V |
| Non-bonded Side Length d d = V^⅓ | $0.983 \times V^{⅓}$ | $0.985 \times V^{⅓}$ | $0.967 \times V^{⅓}$ |
| Increase and Decrease Δd in Non-bonded Side Length | $0.017 \times V^{⅓}$ | $0.015 \times V^{⅓}$ | $0.033 \times V^{⅓}$ |
| Shrinkage Force Ratio | Assumed to be | 88 | 194 |

| Conditions | B (Prior Art) Epoxy 100% Heating Temperature 80° C. | A (Present Invention) | |
| --- | --- | --- | --- |
| | | Epoxy 90% + PVC 10% Heating Temperature 80° C. | Epoxy 90% + PVC 10% Heating Temperature 120° C. |
| $F = k\Delta d$ | | 100 | |

Figure 3:
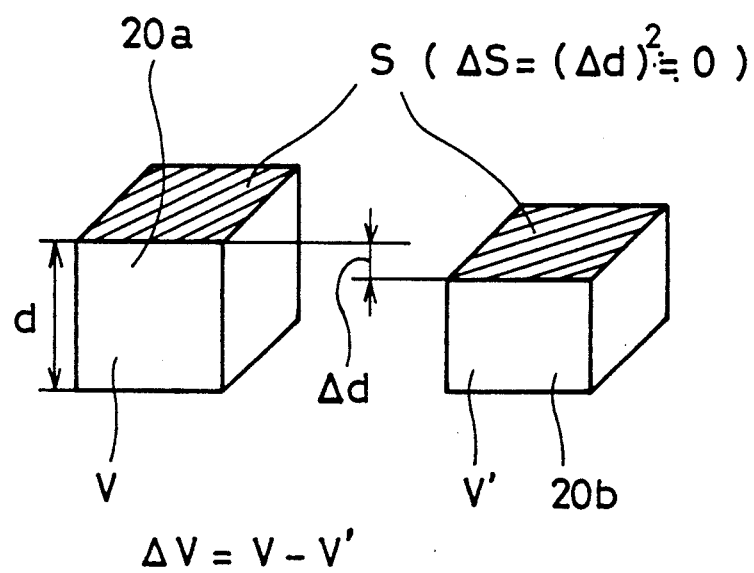
FIG. 3 is a view for explaining a shrinkage effect of a thermosetting resin sheet employed for the present invention.

In FIG. 3, 20a shows a condition of the epoxy resin 20 before heating (pre-heating resin), and 20b shows the epoxy resin after heating (post-heating resin).

For simplicity of calculation, the epoxy resign before heating is assumed to be a cube. When a length of a non-bonded side which does not exist on a bonded surface is d and an area of a bonded surface is S, $$S = d^2, V = d^3$$

and $$\Delta S = (\Delta d)^2.$$

Therefore, $$\Delta S \approx 0.$$

Thus, it is possible to determine that S is invariable. V represents a volume of the pre-heating resin 20a, and V' represents a volume of the post-heating resin 20b. An increase and decrease V$\Delta$ in volume is represented by the difference between V and V' (V—V').

Figure 4:
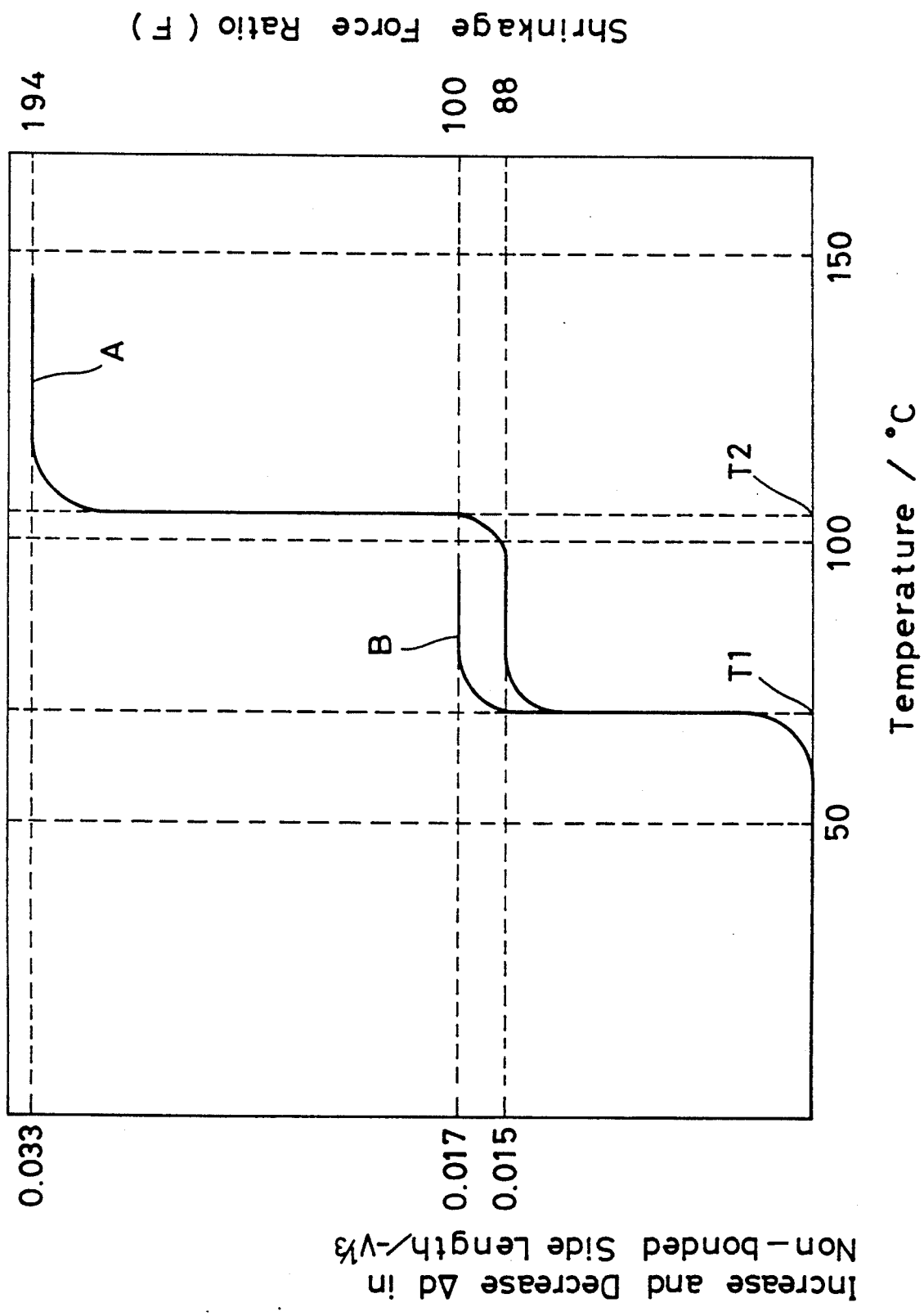
FIG. 4 graphically shows the effect of the thermosetting resin sheet.

The above table shows calculation values relating to A (the present invention) and B (prior art) which values are obtained under the above conditions. FIG. 4 graphically shows the values.

In this embodiment, as described above, shrinkage force of the sheet is nearly doubled if the sheet is heated up to 120° C., and in the case of a sheet of the same configuration, even if the number of bumps is nearly doubled, conductive pattern pressing condition similar to that of the conventional case is obtained.

Returning to FIG. 2, a manner of assembling a semiconductor 10 onto a circuit board 11 according to an assembling method of the present invention will be described.

First, an epoxy resin sheet 20 including PVC with a thickness of 20 μm to 25 μm is temporarily bonded onto a portion, on a surface of the circuit board 11, where no conductive pattern 13 is provided. Then, the semiconductor device 10 is arranged with its face down while bumps 12 formed on the semiconductor device 10 and the conductive patterns 13 formed on the circuit board 11 are being positioned.

Subsequently, the rear surface of the semiconductor device 10 is heated and pressurized by a heating and pressurizing apparatus 30. At this time, the heating and pressurizing apparatus 30 is moved along an arrow 33, and is brought in contact with a rear surface of the semiconductor device 10. The heating and pressurizing apparatus 30 is previously heated by a heater 31. The numeral 32 is a lead of the heater 31. The temperature of 60° C. to 80° C. is supplied to the semiconductor. The pressure is 60 g to 80 g per bump. The heating and pressurizing time is 30 sec to 60 sec. Since the thermally shrinkable particles 21 (PVC) start to shrink at approximately 100° C., the thermosetting particles 21 (PVC) do not shrink although epoxy resin is hardened.

Thereafter, the circuit board 11 to which the semiconductor device 10 is assembled is put into a 120° C. oven for one to two minutes so that the thermally shrinkable particles 21 (PVC) shrink. With this, the assembling is completed.

In FIG. 2, the assembling strength of the bumps 12 formed on the semiconductor 10 and the conductive patterns 13 formed on the circuit board 11 is different from that of FIG. 1 although the number of bumps is the same in both cases. In FIG. 2, the bumps 12 and the conductive patterns 13 are more intensely pressed so that the assembling thereof is stronger. Therefore, an excellent pressing condition of the bump and conductive pattern is obtained even through more number of bumps are provided.

Obviously, many modifications and variations of the present invention are possible in light of the above teachings. It is therefore to be understood that within the scope of the appended claims, the invention may be practiced other than as specifically described.

What is claimed is:

1. A method of assembling an electronic part device and a circuit board, wherein:
    an electrode formed on said electronic part device and a conductive pattern formed on said circuit board so as to be opposite to said electrode are positioned; and
    a thermosetting resin sheet including a thermally shrinkable particle and provided between said electronic part device and said circuit board is hardened and shrunk.

2. A method of assembling an electronic part device and a circuit board according to claim 1, wherein a shrinkage temperature of said thermally shrinkable particle is higher than a hardening temperature of said thermosetting resin sheet.

3. A method of assembling an electronic part device and a circuit board according to claim 1, wherein said electronic part device is a semiconductor device.

4. A method of assembling an electronic part device and a circuit board according to claim 3, wherein the electrode of said semiconductor device is a bump and wherein a thickness of the thermally shrinkable sheet is substantially the same as that of the bump.

5. A method of assembling an electronic part device and a circuit board according to claim 4, wherein said thermally shrinkable sheet does not exist between said bump and said conductive pattern.

* * * * *